Nov. 10, 1970 A. SPIRO ET AL 3,539,759

SUSCEPTOR STRUCTURE IN SILICON EPITAXY

Filed Nov. 8, 1968

INVENTORS
ANDREA SPIRO
WILLIAM H. WHITE
BY
Kane, Dalsimer, Kane, Sullivan & Smith
ATTORNEYS

United States Patent Office 3,539,759

Patented Nov. 10, 1970

3,539,759

SUSCEPTOR STRUCTURE IN SILICON EPITAXY

Andrea Spiro, Pleasant Valley, and William H. White, Poughkeepsie, N.Y., assignors to International Business Machines Corporation, Armonk, N.Y., a corporation of New York Filed Nov. 8, 1968, Ser. No. 774,339

Int. Cl. H05b 5/00, 9/00

U.S. Cl. 219—10.49 4 Claims

ABSTRACT OF THE DISCLOSURE

This invention is directed to apparatus to process semiconductor wafers. It provides carrier apparatus for supporting the semiconductors for treatment in a heated region with the semiconductor wafer substantially only edge supported in a carrier structure adapted for positioning within a high frequency energy inductive field to introduce electromagnetic heating effects which are confined to the regions of the wafers as supported.

This invention relates to a method and an apparatus for handling semiconductor wafers during fabrication into semiconductor devices, and particularly during the high temperature treating stage.

In fabricating semiconductor devices, such as integrated circuit devices, the operation starts with a relatively small wafer which may be as small as one-half inch in diameter and then range to a dimension of about one and one-half inch in diameter. The formation of the wafer and its dimensional limitations are not part of this invention.

In the formation of the integrated circuity, one of the highly developed present conventional methods involves the deposition of selected materials in gaseous state onto a selected surface of the semiconductor wafer being processed. With the wafer serving as a base or substrate, the deposition operation from a gaseous state requires the operation to be conducted at an elevated temperature. In accordance with present conventional procedure, a heated region is provided within a quartz reactor tube that is surrounded by an induction coil arranged to be connected to a high frequency source to provide, when energized, the necessary operational heat.

The carrier is a graphite susceptor which will not react chemically with the semiconductor material of the wafer. In addition, the susceptor receives and accumulates the heat induced in it by the high frequency field of the coil surrounding the reactor tube.

Present conventional practice utilizes the graphite susceptor, or boat as it is occasionally referred to, merely as a support that will tolerate high temperature and not react chemically with the semiconductor material at such elevated temperature. In order to obtain a high degree of predictability in the operating characteristics of the finished wafer when subjected to such high temperatures during fabrication, it is not only desirable but necessary to establish substantial uniformity in the conditions that exist in the several wafers of any one batch and also in wafers of different batches. This is generally somewhat of a problem with present procedures, because the temperature within such a quartz reactor tube is not necessarily uniform throughout the entire volume of the space within the tube. Temperature gradients may exist within that space in the quartz reactor tube. The distribution and spacing of the wafers on the graphite susceptor carrier surface will necessarily place the various wafers in different zones of the heated space within the quartz tube as they are moved and come into the heated space. As a consequence, several gradients are possible which is undesirable.

Moreover, the position of the graphite susceptor carrier may vary from batch to batch and from operation to operation so that, again, temperature variations or gradients may be established in the internal region of the quartz reactor tube as a furnace. Further, the treatment of the semiconductor wafers within the quartz tube furnace will be affected by the introduction of the different gaseous materials into the furnace for treating the surfaces of the semiconductor wafers, and the movement of such gaseous materials will in themselves create non-uniform thermal conditions with the existence of temperature gradients that could establish non-uniform temperature conditions on the surfaces and in the bodies of the semiconductor wafers. All of these possibilities would, in turn, set up unbalanced temperature gradients on the surface and to some extent at least within the bodies of the semiconductor wafers.

The graphite susceptor carrier which supports a batch of semiconductor wafers during the treating operation, provides a certain amount of temperature stabilization for the wafers. However, as presently utilized, the carrier function is primarily and mainly merely that of a support and carrier and is not being utilized to provide an equally important primary function of stabilizing the temperature conditions in the individual semiconductor wafers of a batch of wafers being treated at any one time.

A primary object of this invention is to provide a new philosophy and method of treatment of semiconductor wafers by controlling the temperature of the body of wafer and particularly the surface to be treated, in order to establish a high degree of uniformity of temperature distribution over the surface of each wafer irrespective of its location on the supporting graphite susceptor carrier so the occurrence or existence of internal thermal temperature gradients and consequent internal stresses, will be minimized and eliminated.

Another object of the invention is to provide a method of treatment of the semiconductor wafers that will establish a high degree of uniformity of heat distribution throughout the wafer and the surfaces to be heated and, as a consequence, provide both a higher level of temperature in each wafer and a more uniformly averaged distribution of temperature throughout each wafer.

Another object of the invention is to provide an isothermal border region on each wafer surface to be treated to thereby limit and generally prevent edge radiation of heat from the wafer. This will tend to establish a higher surface temperature on the wafer and insure a substantially regular and uniform distribution of temperature levels over the complete surface of the wafer within the area of the isothermal border.

Another object of the invention is to provide a temperature transfer relationship between the graphite susceptor carrier and the wafers supported thereon, so that the carrier itself will serve also as a temperature stabilizer for each wafer supported thereon.

Another object of the invention is to provide a graphite susceptor carrier constructed to embody a stabilized temperature maintaining zone for each wafer where the wafer is supported on the carrier.

Another object of the invention is to provide on the graphite carrier, suppotring zones in regular closed form, each as an annulus, for supporting a semiconductor wafer at a border zone adjacent the periphery of the wafer, to limit or prevent loss of heat by edge radiation from the wafer to the surrounding atmosphere.

As a result, the temperature of the wafer becomes sufficiently stabilized to establish a greater degree of temperature averaging with the result that a more uniform temperature level can be established and maintained over the surface of the wafer that is to be treated.

Such uniformity of temperature reduces and limits the possibility of internal temperature gradients that might otherwise cause defective conditions or conditions that would cause a finished device to be defective because of internal distortions that might be created by the differential cooling effects due to the internal differential stresses at elevated temperatures.

The large mass of the graphite carrier serves to provide a relatively stable and substantially uniform temperature zone immediately surrounding each wafer and in thermally conductive relation to that wafer to aid in establishing the averaging high temperature condition in the body of the wafer and across the top surface that is to be treated for fabricating the desired device.

The construction of a carrier for the wafers is so arranged and designed to shield the wafer from any inner currents or movements within the heat treating region that would reach any surface of the wafers other than that which is to be treated for the fabrication purpose.

The construction of a carrier for the wafers is in a pocket or recess for receiving each wafer to achieve the optimum thermal control within this invention and will be described in the following description and/or shown and explained in more detail in connection with the accompanying drawings, in which.

Figures 2, 3, 4, 5, 6:
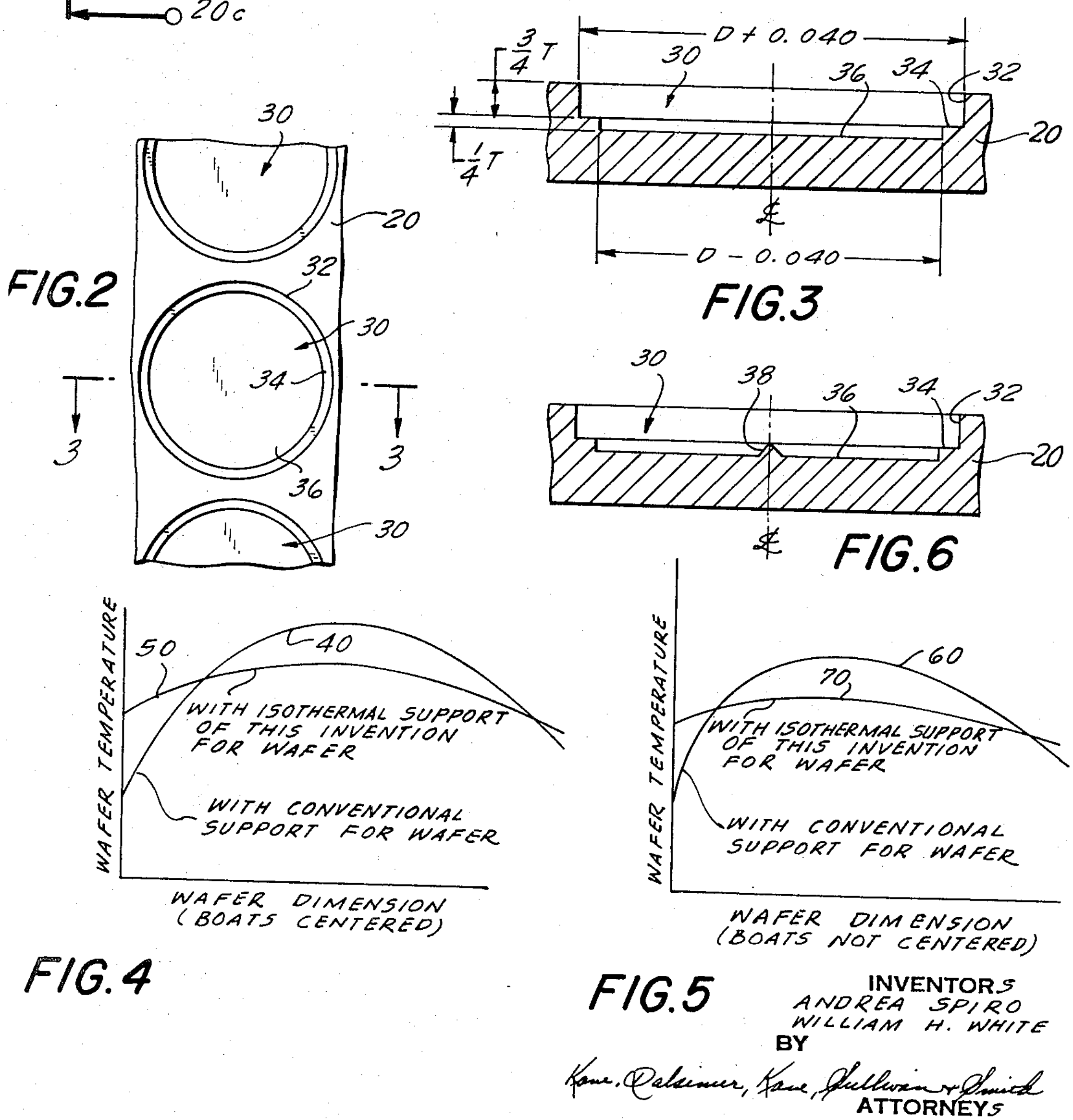
FIG. 2 is a plan view on an enlarged scale of a portion of the carrier to show the recess or pocket for a wafer.
FIG. 3 is a sectional view taken along the line 3—3 in FIG. 2 and shows a sectional profile of the recess or pocket in the carrier for accommodating and supporting a wafer.
FIG. 4 shows a typical graph to illustrate the beneficial temperature averaging effect of the present invention for a wafer carrier or boat intentionally centered with respect to the axis of the heating region within the heating tube within which the wafers are to be treated for film deposition.

FIG. 5 is a graph similar to that in FIG. 4 except that the carrier or boat was not necessarily centered in the heat treating region, but merely inserted at random and left in random position; and FIG. 6 is a showing generally like FIG. 3, except that it is adapted to use with substantially larger diameter wafers and to preclude any possibility of central sagging during heating the carrier has a substantially pin-like central support extending from the container floor surface to a height where it will barely touch the wafer and provide an additional support.

Figure 1:
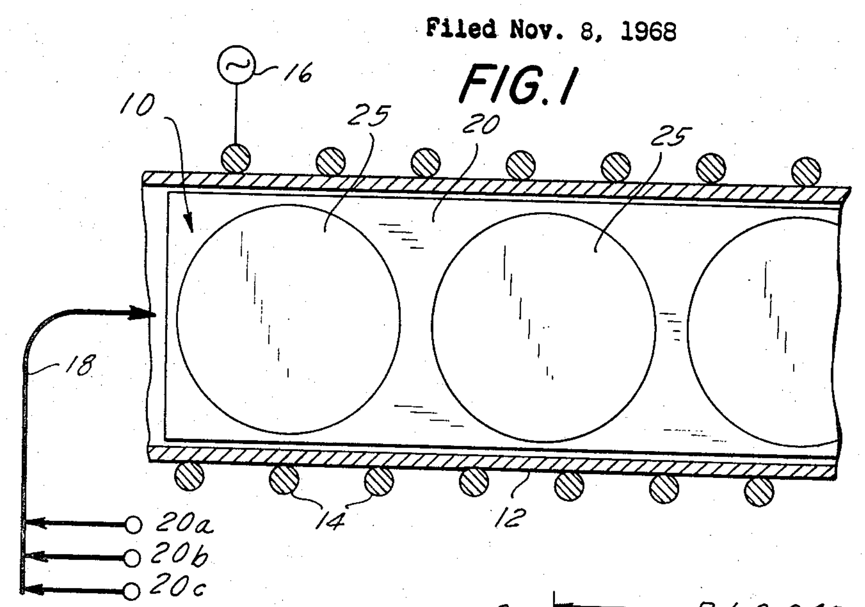
FIG. 1 is a schematic plan view of a treating chamber within a quartz tube for accommodating a boat or carrier for one or more wafers to be subjected to the heating effect from a high frequency field to raise the wafers to appropriate treating temperatures to permit the deposition of desired materials in film form to fabricate semiconductor devices.

As shown in FIG. 1, a treating chamber 10 is schematically illustrated as comprising a quartz tube enclosure 12 surrounded by a high frequency heating coil 14 arranged to be suitably energized from a high frequency source schematically indicated at 16 to generate a high frequency magnetic field within the quartz tube to heat any object or material placed within that space. A suitable conduit connection is indicated at 18 through which desired materials may be introduced into the treating chamber 10 from suitable gaseous sources illustrated at *20a*, *20b*, *20c*, etc. A graphite susceptor carrier or boat 20 is used for supporting a batch of wafers 25 of suitable semiconductor material within the quartz reactor tube 12 for the desired treatment within the compartment 10 during the fabrication of the wafers into semiconductor devices.

When the high frequency coil 14 is energized from its source 16, the carrier or boat 20 and the crystal wafers 25 both absorb heating energy from the high frequency magnetic field. The mass of the carrier 20 is substantially greater than the mass of the batch of crystal wafers 25 and the heat stored in the graphite carrier, if properly utilized, may be used to aid in establishing and maintaining a desired balanced and relatively uniform temperature across the top exposed surface of each wafer in order to provide optimum conditions for depositing of films of selected material from any of the materials introduced within gaseous state through the conduit 18 for such treatment of the wafers.

Graphite susceptor carriers have been employed previously for supporting the wafers within the quartz reactor tube, for the purpose of heating the wafers for such treatment, but the prior conventional arrangements between the susceptor carrier and the wafer supported thereon have not fully utilized the stabilizing character of the carrier to aid in establishing and in maintaining average, balanced and substantially uniform temperature conditions across the face of the wafer to be treated and covered by a film of the various materials for treatment.

Function and intent of the present invention is to utilize the graphite carrier and its mass, to establish isothermal border zones around each of the wafers to be heated and treated, whereby all of the heat collected and stored in the wafers and also in the graphite carrier will be utilized and directed ultimately into the wafers with optimum averaged distribution of the heat so the temperature of the exposed surfaces of the wafers will be maintained at a high average level with minimum edge effect or loss of heat from a lesser heated edge portion of a wafer, as in present conventional systems, due to the lack of complete thermal conductivity relationship between each of the wafers and its supporting graphite carrier.

The manner in which that is accomplished in the present invention is shown particularly in FIG. 2 and FIG. 3.

As shown in FIG. 2, the graphite susceptor carrier 12 is provided with several pockets or recesses 30 for respectively receiving a single wafer appropriately dimensioned to be accommodated by the carrier 12 according to the dimensions of the pockets and recesses provided for the wafers.

The pocket 30 shown in FIG. 2 is circular and embodies an outer circular rim 32 for an annular shoulder or ledge 34 above a floor 36, all of which are shown in clear detail in the sectional view of FIG. 3 taken along the lines 3—3 of FIG. 2.

As shown in FIG. 3, the circular rim 32 for the opening or recess 30 serves as an outer limit of the space for confining a wafer whose dimensions will be such as to permit the wafer to slide comfortably down into the recess 30 to seat on the annular shoulder 34. As indicated, the diameter of the circular space defined within the rim 32 is indicated to be D+0.040 inch, where D represents the assumed diameter of the wafer to be accommodated. Thus, the wafer may be inserted into its succeeding position and removed therefrom without any friction against the peripheral rim surface 32.

The width of the seating annulus 34 is indicated by the dimension of the floor 36, which is shown to be D−0.040 inch, where the D again represents the diameter of the wafer to be accommodated.

The two specified diametrical dimensions of the recess or pocket insure easy insertion and removal of a wafer into and from the recess, with no friction, and at the same time, provide a relatively uniform supporting ledge for the border of the wafer. The vertical dimensions of the pocket or recess, are generally indicated in FIG. 3 where the letter T represents the thickness of a raw wafer before treatment. As shown, about three-fourths of the thickness of the wafer extends downward into the recess to be the plane of support on the annular surface 34. The height of that annular surface 34 is relatively small and is made to be of the order of one-fourth of the thickness of a seated wafer.

Since the entire wafer is adapted to be supported as illustrated in the arrangement shown in FIG. 2, the sectional view shown in FIG. 3 is also symmetrical. It, therefore, may be considered as representative of the entire wafer condition in its thermal relationship to the supporting graphite carrier 12.

As shown in FIG. 3, the bottom surface of a seated wafer will be relatively close to the floor surface 36 at the bottom of the recess 30 and the entire surface of the wafer will therefore be heated by the radiant heat from that floor surface 36. At the same time, the annular border of the wafer seated on the annular shoulder or seat 34 will be maintained at a relatively uniform temperature as controlled and stabilized by the relatively large mass of the graphite susceptor carrier 12. Consequently, there is no place at which the wafer can gain or lose heat energy asymetrically. Thus, by the provision of an isothermal zone around the edge of each wafer, the temperature of the entire surface of the wafer becomes averaged out, so that the temperature over the entire surface of each wafer becomes more uniform than in present or previous systems as conventionally employed. The presence of temperature differentials between adjacent points within the small crystal wafer is thus substantially suppressed or eliminated. Consequently, any film formations or deposits on the upper surface of the crystal wafer are not subjected to distorted differential stresses during the cooling of a wafer to normal ambient temperatures.

FIGS. 4 and 5 show typical graphs taken of data from conventional arrangements in which the crystal wafers are not supported in such manner as to provide complete isothermal supporting edges for the wafer, and then with data obtained from crystals supported according to the present invention with isothermal supporting edges for the respective wafers.

As shown in FIG. 4, the two graphs 40 and 50 are further identified and characterized by the legends which indicate the conditions from which the graphic data was obtained.

As shown, the graph 40 representing the conventional type of support for wafers shows a peaked type of curve with substantial drop-off at the peripheral edge. On the other hand, graph 50 corresponds to the temperature distribution across the face of a wafer which is isothermally supported at its border edge in accordance with the teachings of this invention.

The arrangement shown in FIG. 4 was taken with boat or carrier centered within the heating region in the tube in order to ascertain whether random disposition of the carrier might affect the operation of this invention. FIG. 5 shows two graphs which indicate that even though the carrier or boat is not centered within the heating region, substantially the same benefit is obtained from the isothermal type of support for each wafer.

As shown in FIG. 5, two graphs 60 and 70 represent the data taken under the two conditions. The graph 60 is taken from data where the wafers were conventionally supported without the provision of an isothermal support over the entire border edge of the wafer. That curve shows the same peaked condition with substantial dropping off at the edges. The graph 70 shows a condition similar to graph 50 in FIG. 4 where the effect of the isothermal support for the wafer was to balance out the condition of the conventional graph 60 by maintaining a substantially isothermal condition around the peripheral edge of the wafer and thus providing a better averaged condition of temperature over the entire wafer surface, due in part to the effective raising of the temperature of the edge of the wafer by the provision of that isothermal support.

The curves shown in FIGS. 4 and 5 represent normalized figures with respect to the top values of each set of curves with respect to any measured condition, so that the actual temperatures at which the measurements were taken were not controlling.

In the usual case, the crystal wafers 25 are relatively small in diameter and, of course, very thin. In some instances it has been found nevertheless that the invention is also applicable to larger diameter wafers. As the diameter of the wafer is increased, there is naturally with heating a chance of expansion and a slight central sagging. The modification shown by FIG. 6 avoids this possibility by providing from the floor surface 36 an upwardly extending supporting element means 38 which extends upwardly for a distance so that when the wafer rests upon the level of the seating annulus 34, contact will just barely be made. With this arrangement, even with the heating the wafer is precluded from sagging and the desired results are obtained. This also may have the effect of improving the thermal characteristics on the larger diameter element so that the aims and objectives of the invention are fulfilled. This means normally is of pin-like character but can be of any form to preclude sagging and a change from the level plane of the wafer.

Thus, providing a counter-bore support in the recess for the wafer, so that the wafer is suspended by its periphery and does not come in contact with the susceptor carrier over the major portion of its area, certain advantageous features have resulted as follows:

(1) Substrates are heated primarily by radiation from the susceptor thus eliminating localized heated regions due to uneven physical contact between substrate and susceptor.

(2) More uniform temperatures are achieved across the substrate slice due to radiation heating in the center and both conduction and radiation heating at the periphery where the slice is generally at a lower temperature due to edge effects.

(3) More even heating of the substrate results in more uniform growth over the wafer surface as well as more uniform silicon removal during vapor etching of the silicon substrate.

(4) Reduction and virtual elimination of mass transport of silicon from the susceptor to the substrate back (contact side). The backs of the substrates are smoother because the silicon spines which grow at points of contact between substrate and susceptor are eliminated.

From the foregoing it becomes apparent that the wafer is generally circular and is held at substantially its edges within the boat. The boat is placed within the reactor tube and therefore occupies a position which is substantially transverse to the tube at its point of greatest diameter. With these conditions obtaining, the application of high frequency energy to the coils 14 tends to produce an electromagnetic heating effect which becomes greatest, as far as either the wafer or the supporting boat is concerned, in the region of each which is closest to the interior wall of the reactor tube. However, it likewise can be appreciated that the central portion of the wafer is further removed from the region of the inductive winding about the reactor tube and consequently the electromagnetic inductive heating effect is reduced substantially as a sine function. This reduction is effectively compensated by reason of the fact that there is thermoconductivity introduced through the boat itself, as well as through the wafer itself, and, of course, the weaker field as the wrapped conductor is further away from the plane of the wafer and boat. This overall effect then tends to bring about substantially an isothermal condition throughout the entire wafer and consequently the desired processing is readily achieved.

The invention may be modified to the extent of varying the disposition in quantity of wafers and, therefore, correspondingly adjusting the shape of the carrier, and the dimensions indicated for the recess and degree of contact between the carrier and the wafers may be varied, without departing from the spirit and scope of the invention, all of which are set forth herein and in the claims.

Having now described the invention, what is claimed is:

1. Apparatus for processing semiconductor wafers comprising:

(A) a quartz reactor tube for enclosing a region to be heated;

(B) inductive means surrounding the reactor tube and adapted to receive high frequency current to create an inductive heating field within said reactive tube;

(C) a carrier of susceptor material for supporting semiconductor wafers for treatment in said reactor tube within said field, with said carrier containing at least one recess in an exposed top surface thereof and having in each recess a cylindrical counter-bore forming an annular flat-surface below said top surface to support an annular border around an edge of a seated wafer disposed within said recess, with said recess defined by an imperforate bottom wall below said annular surface.

2. The apparatus of claim 1 wherein said carrier includes a wafer support element means on said bottom wall extending upwardly to substantially the plane of said annular border.

3. The apparatus of claim 2 wherein said wafer support element means extends upwardly from the bottom wall only to a contacting position relative to the bottom side of said wafer adapted to be supported at the annular edge thereby to preclude sagging of the wafer between its edges upon application of heat.

4. The apparatus of claim 3 wherein the wafers support element means is a single protrusion substantially centrally positioned relative to the annular border.

References Cited

UNITED STATES PATENTS

| | | | |
|---|---|---|---|
| 2,826,666 | 3/1958 | Cater | 13—1 |
| 3,272,350 | 9/1966 | Pflaumer et al. | 214—1 |
| 3,399,651 | 9/1968 | Fornari | 219—10.49 X |
| 3,436,255 | 4/1969 | Harris et al. | 117—106 |

JOSEPH V. TRUHE, Primary Examiner

L. H. BENDER, Assistant Examiner

U.S. Cl. X.R.

117—106; 118—48; 148—175; 219—10.41